US007251190B2

(12) United States Patent
Imamiya et al.

(10) Patent No.: US 7,251,190 B2
(45) Date of Patent: \*Jul. 31, 2007

(54) NON-VOLATILE SEMICONDUCTOR MEMORY DEVICE

(75) Inventors: Kenichi Imamiya, Tokyo (JP); Koichi Kawai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

This patent is subject to a terminal disclaimer.

(21) Appl. No.: 11/165,683

(22) Filed: Jun. 24, 2005

(65) Prior Publication Data

US 2005/0243620 A1 Nov. 3, 2005

Related U.S. Application Data (63) Continuation of application No. 10/822,957, filed on Apr. 13, 2004, now Pat. No. 6,930,954, which is a continuation of application No. 10/316,166, filed on Dec. 10, 2002, now Pat. No. 6,741,499.

(30) Foreign Application Priority Data

Dec. 10, 2001 (JP) ............................. 2001-376032

(51) Int. Cl.
*G11C 8/00* (2006.01)
(52) U.S. Cl. ............ 365/233; 365/185.17; 365/189.05; 365/226; 365/228
(58) Field of Classification Search ................ 365/233, 365/185.17, 189.05, 226, 228
See application file for complete search history.

(56) References Cited

U.S. PATENT DOCUMENTS

| 4,451,903 | A |   | 5/1984 | Jordan ......................... 365/94 |
| 5,956,289 | A | * | 9/1999 | Norman et al. ............. 365/233 |
| 6,052,313 | A |   | 4/2000 | Atsumi et al. ......... 365/189.05 |
| 6,462,985 | B2 |  | 10/2002 | Hosono et al. ........ 365/185.09 |

(Continued)

FOREIGN PATENT DOCUMENTS

JP 2001-176290 6/2001

*Primary Examiner*—Connie C. Yoha
(74) *Attorney, Agent, or Firm*—Hogan & Hartson LLP (57) ABSTRACT

A non-volatile semiconductor memory device includes a memory cell array having electrically erasable and programmable non-volatile memory cells, a part of the memory cell array being defined as a initial set-up data region for storing a plurality of initial set-up data that define memory operation conditions, data latch circuits for holding the initial set-up data read out from the initial set-up data region, a controller for controlling data program and erase operations for the memory cell array, and a clock generator for generating a clock, signal that is used to define an operation timing of the controller, wherein the controller is configured to perform such an initial set-up operation that sequentially reads out the plurality of initial set-up data stored in the initial set-up data region and transfers them to the respective data latch circuits on receipt of power-on or a command input, the initial set-up operation being so performed as to read out a clock cycle adjustment data within the plurality of initial set-up data stored in the initial set-up data region in the beginning, thereby adjusting a clock cycle of the clock signal output from the clock generator by use of the clock cycle adjustment data, and then reads out the remaining initial set-up data by use of the adjusted clock signal.

14 Claims, 6 Drawing Sheets

U.S. PATENT DOCUMENTS

| | | |
|---|---|---|
| 6,643,180 B2 | 11/2003 | Ikehashi et al. ........ 365/185.22 |
| 6,653,877 B2 * | 11/2003 | Tsujino ........................ 327/161 |
| 6,741,499 B2 * | 5/2004 | Imamiya et al. ........ 365/185.17 |
| 6,751,122 B2 | 6/2004 | Kawai et al. ........... 365/185.09 |
| 6,760,256 B2 | 7/2004 | Imamiya ................. 365/185.17 |
| 6,930,954 B2 * | 8/2005 | Imamiya et al. ............. 365/233 |

* cited by examiner

NON-VOLATILE SEMICONDUCTOR MEMORY DEVICE

CROSS-REFERENCE TO RELATED APPLICATION

This is a continuation of application Ser. No. 10/822,957 filed Apr. 13, 2004, now U.S. Pat. No. 6,930,954 which is a continuation of application Ser. No. 10/316,166 filed Dec. 10, 2002, now U.S. Pat. No. 6,741,499, which applications are hereby incorporated by reference in their entirety.

This application is based upon and claims the benefit of priority from the prior Japanese Application No. 2001-376032, filed on Dec. 10, 2001, the entire content of which is incorporated herein by reference.

BACKGROUND OF THE INVENTION

1. Field of the Invention

The present invention relates to a non-volatile semiconductor device.

2. Description of Related Art

A large scale semiconductor memory device is formed to contain redundant circuits for replacing defective cells with them. It's the same to an electrically erasable and programmable non-volatile semiconductor memory device (EEPROM). In a conventional redundant system, a redundant row cell array and a redundant column cell array are disposed in addition to a normal cell array, and a fuse circuit is disposed for storing defective addresses. Such the fuse circuit is typically formed by use of laser-programming type fuses.

A defective address is found in a wafer test, and programmed in the fuse circuit. After the fuse circuit programming, an input address is transferred to the fuse circuit and compared with the programmed defective addresses. If address matching is detected, decode circuits are controlled by the detected output to replace a defective cell array with a redundant cell array.

Fuse circuits are used for storing not only the above-described defective addresses, but also many kinds of initial set-up data (i.e., initializing data) that are used for determining memory operation conditions. Such initial set-up data include, for example, trimming data for adjusting internal voltages in corresponding to a process variation among wafers or chips, another trimming data for adjusting programming voltage, control parameters such as sequence loop numbers of program and/or erase sequence, and the like.

However, once the fuse circuit is programmed, it is impossible to reprogram the fuse circuit. Further, the wafer test for detecting defective addresses by use of a tester and laser-programming process for the fuse circuit are performed as different processes from each other. These processes can not be performed as one continuing step. Considering the above-described viewpoint, it has been provided to use such a system that non-volatile memory cells as similar to that of an EEPROM are used as an initial set-data storing circuit in place of the fuse circuit. By use of such the system, data programming may be performed more easily than the fuse circuit, and data reprogramming may also be performed.

However, if a cell array for storing defective addresses and the like is disposed at a different place from the normal cell array area, decode circuits and sense amp circuits are necessary for the respective cell arrays. Therefore, the circuit configuration becomes to be complicated, and the chip size becomes large. Additionally, in such a case that check and correct of the programmed data is required, operation control thereof is not easy.

In order to solve such the problem, the present inventors have already provided such a system that an initial set-up data region is defined in the normal cell array (see, Japanese Patent Application 2001-176290A). The initial set-up data stored in the initial set-up data region in the cell array are automatically read out after when the power supply is switched on by use of the same decoder and sense amp as used in normal data read mode, and then transferred to and held in the respective initial set-up data latch circuits. Hereinafter, the memory operation conditions are defined by the outputs of the initial set-up data latch circuits.

Bu use of such the system, the circuit configuration becomes simpler, and the chip size becomes smaller. Check and correct of the initial set-up data can also be performed easily. In this system, the period from power-on time to the initial set-up end becomes a waiting period while normal data read and normal data program are inhibited. Therefore, in such a case that the amount of the initial set-up data is large and/or verify operations are requested, it is necessary to shorten the above-described waiting period if possible.

Another reason why the waiting period becomes long is in such a fact that the initial set-up data are read out by an internal clock signal generated in the memory chip. While the internal clock is not adjusted by a trimming data that is prepared for canceling process variations, the clock cycle of the internal clock has a large variation. If the clock cycle is shifted to a long-cycle side, the waiting period will become long. Further, the read operation of the initial set-up data is performed as soon as power-on, the power supply voltage is not yet stable. This also leads the waiting period to be long.

SUMMARY OF THE INVENTION

A non-volatile semiconductor memory device is provided to include a memory cell array having electrically erasable and programmable non-volatile memory cells, a part of the memory cell array being defined as a initial set-up data region for storing a plurality of initial set-up data that define memory operation conditions, data latch circuits for holding the initial set-up data read out from the initial set-up data region, a controller for controlling data program and erase operations for the memory cell array, and a clock generator for generating a clock signal that is used to define an operation timing of the controller, wherein the controller is configured to perform such an initial set-up operation that sequentially reads out the plurality of initial set-up data stored in the initial set-up data region and transfers them to the respective data latch circuits on receipt of power-on or a command input, the initial set-up operation being so performed as to read out a clock cycle adjustment data within the plurality of initial set-up data stored in the initial set-up data region in the beginning, thereby adjusting a clock cycle of the clock signal output from the clock generator by use of the clock cycle adjustment data, and then reads out the remaining initial set-up data by use of the adjusted clock signal.

DETAILED DESCRIPTION OF THE EMBODIMENTS

Referring to the drawings, an embodiment of the present invention will be described in detail.

Figure 1:
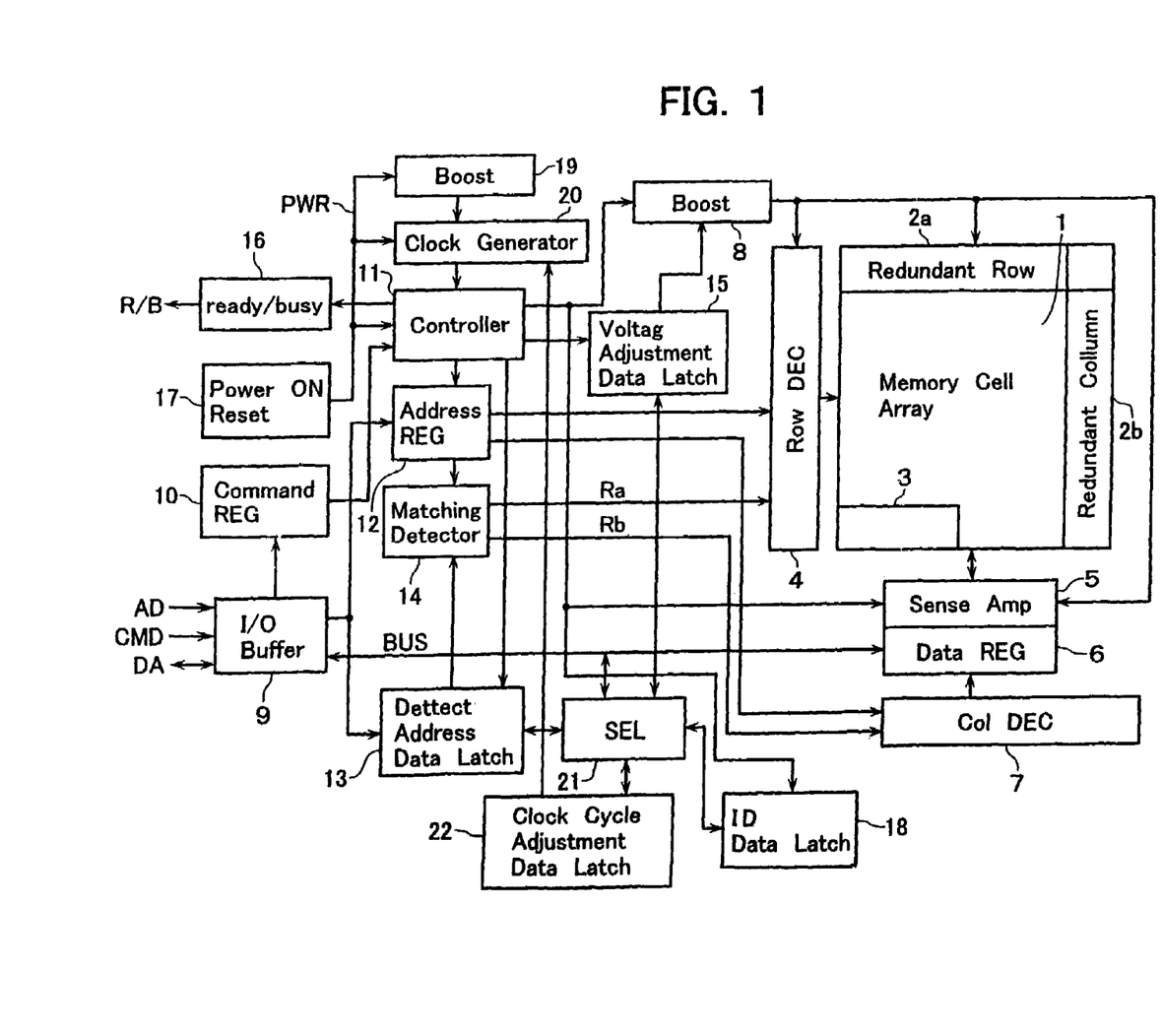
FIG. 1 shows an EEPROM configuration according to an embodiment of the present invention.

FIG. 1 shows an EEPROM configuration according to the embodiment of the present invention. Memory cell array 1 is formed of electrically erasable and programmable non-volatile memory cells that are arranged in a matrix manner. Each the memory cell is a stacked-gate type MOS transistor having a floating gate and a control gate stacked thereon. In the memory cell array 1, redundant row cell array 2a and redundant column cell array 2b are disposed for replacing defective cells. An initial set-up data region 3 in the cell array 1 is predefined as a region for programming initial set-up data that are used for determining memory operation conditions.

Figure 2:
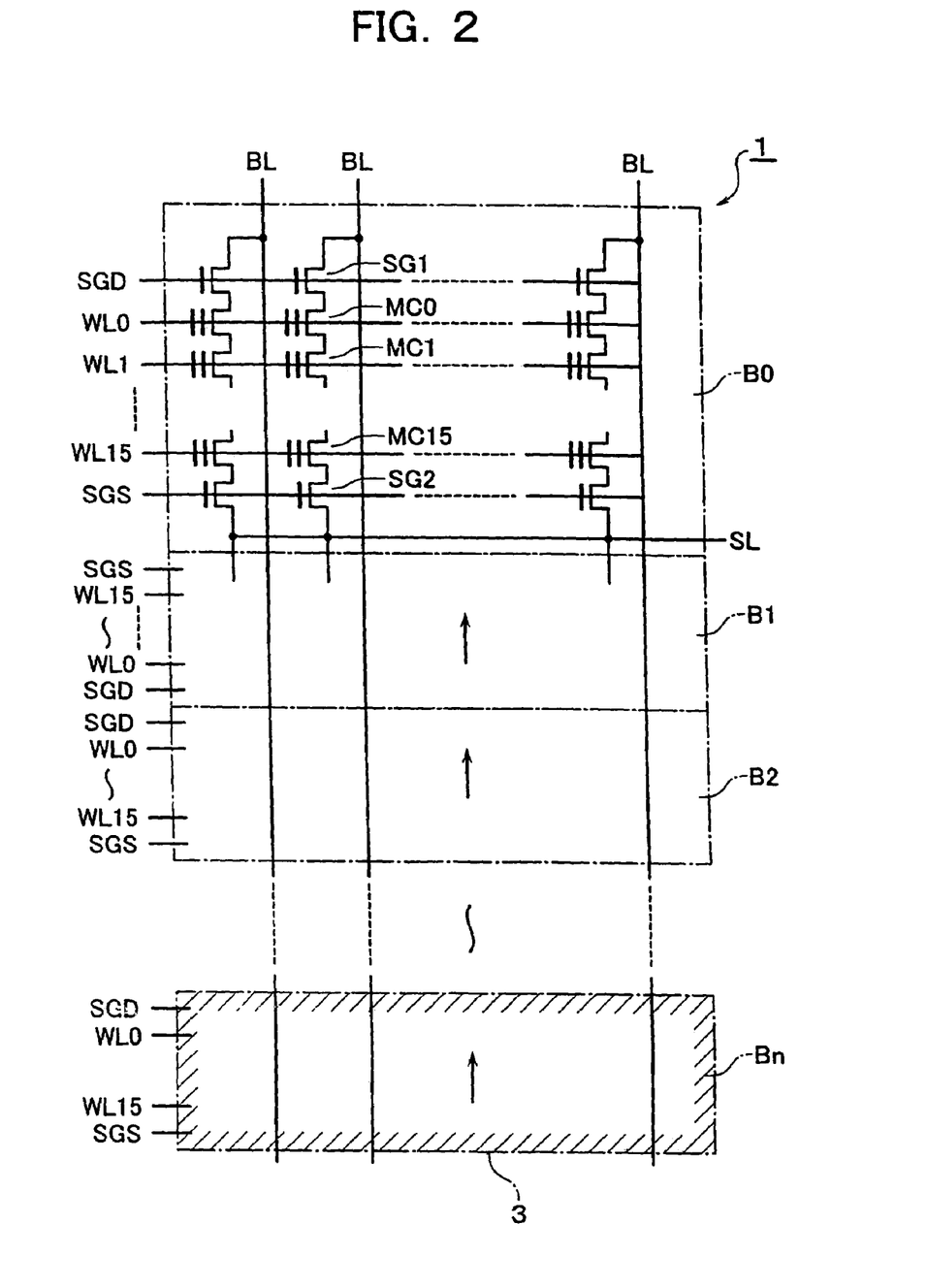
FIG. 2 shows a memory cell array configuration of the EEPROM.

FIG. 2 shows an equivalent circuit of the memory cell array 1. In this example, sixteen memory cells, which are serially connected and driven by sixteen word lines, respectively, constitute a NAND cell unit. One end of the NAND cell unit is connected to a bit line BL via a select transistor SG1, and the other end is connected to a common source line SL via another select transistor SG2.

NAND cell units, which are arranged along the word line WL, constitute a NAND cell block which serves as a minimum erase unit. In FIG. 2, cell blocks B0, B1, ..., Bn are arranged with a shared bit line BL. In such the cell array 1, the cell block Bn that is disposed at one end portion of bit line BL is, for example, defined as the initial set-up data region 3.

The initial set-up data region 3 may be programmed, erased and read out by selectively driving a bit line BL and a word line WL. However, as described below, the region 3 is not able to be accessed from external terminals during the EEPROM is in a normal operation mode. In a data erase mode for each cell block or as a whole, the initial set-up data region 3 is not set to be in an erase condition.

In the NAND type EEPROM of this embodiment, the minimum unit of the initial set-up data region 3 is defined as a NAND cell block serving as a minimum erase unit. This is preferable for memory designing because the device layout, circuit operation condition and the like of the initial set-up data region 3 are the same as that of other NAND cell blocks. However, if the size of data stored in the initial set-up data region 3 is small, the cell block of the region 3 may be constructed with less word lines than the normal cell block. In this case, the memory chip area can be made smaller.

Bit lines BL of memory cell array 1 are connected to data register 6 through sense amplifier circuit 5. In ordinary cases, the sense amp circuit 5 and data register 6 are integrally formed with data latch circuits as shared therebetween. Column decoder 7 and row decoder 4 are prepared for selecting a bit line BL and a word line WL, respectively. Address AD and command CMD are input to address register 12 and command register 10 through I/O buffer 9, respectively. To-be-programmed data DA are input into the I/O buffer 9 and then transferred to data register 6 via data bus BUS.

Row address and column address are decoded by row decoder 4 and column decoder 7, respectively, thereby selecting memory cells. Many kinds of high voltages as used for data programming and erasing are generated by a boost circuit 8. The command data taken in the command register 10 is, for example, decoded by controller 11. The data program and erase sequences are controlled by the controller 11.

In a program mode, such a sequence control is performed that a verify operation is performed for verifying the programmed state of selected memory cells, then the sequent reprogram operation is performed for insufficiently programmed cells. In a erase mode, in like manner, such a sequence control is performed that a verify operation is performed for verifying the erased state of selected memory cells, then a sequent re-erase operation is performed for insufficiently erased cells. By setting such the program or erase mode, the above-described program or erase sequence is controlled by the controller 11. An operation clock signal used in controller 11 is generated by a clock generator 20, and then supplied to the controller 11.

Initial set-up data as stored in the initial set-up data region 3 of the memory cell array 1, most of which are obtained in a wafer test step, are as follows:

(1) defective address data (2) control data for data programming and erasing (voltage data, number of program and erase control loops and the like)

(3) code data such as memory capacity, memory specifications, and chip information (for example, ID code and maker code)

(4) clock cycle adjustment data

These initial set-up data are programmed into the initial set-up data region 3 by receiving a predetermined command input after memory chip packaging and before memory chip shipment. Although the row decoder 4 and column decoder 7 are configured to be accessible for the whole of memory cell array 1, no address is assigned to the initial set-up data region 3 for normal data program and read mode. Therefore, in these normal modes, the initial set-up data region 3 is not able to be accessed by external addresses. Only when a predetermined command is input, the controller 11 makes the address register 11 generate internal address data for selecting the initial set-up data region 3. Whereby, it is able to program the initial set-up data into the initial set-up data region 3.

Ready/busy register 16 is prepared to output a ready/busy signal that designates permission or inhibition with respect to accessing the memory cell array. During the initial set-up operation, the ready/busy register 16 outputs ready/busy(R/B)="L" (busy). Power-on reset circuit 17 is a power-on detecting circuit for detecting an event that the power supply switch is turned-on, and outputting a power-on reset signal PWR. Controller 11 is activated by the power-on reset signal PWR, and begins to perform a programmed operation control.

In this embodiment, a boost circuit 8 is prepared for outputting a high voltage that is necessary in the program mode, erase mode and the like. In addition to the boost circuit 8, another boost circuit 19 is prepared for stabilizing the clock signal output from the clock generator at an early time after power-on. That is, the boost circuit 19 outputs an internal power supply voltage that is supplied to a power supply terminal of the clock generator 20 on receipt of the power-on reset signal PWR.

Figure 3A:
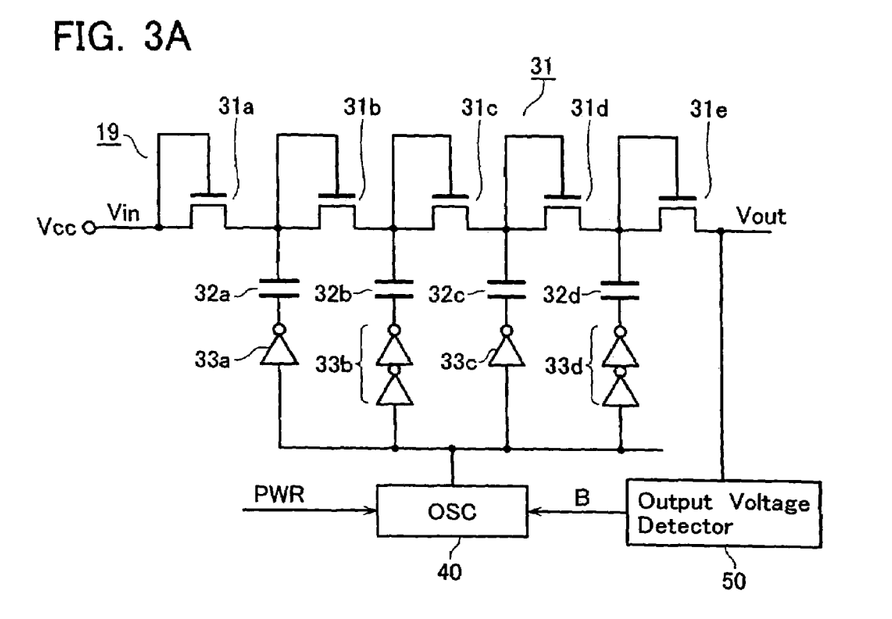
FIGS. 3A to 3C show a boost circuit 19 of the EEPROM.

FIG. 3A shows a construction of the boost circuit 19. The boost circuit 19 is composed of an MOSFET array 31, capacitors 32, drivers 33, an oscillator 50 and an output detecting circuit 50. The MOSFET array 31 and capacitors 32 constitute a charge pump circuit.

MOSFET array 31 has diode-connected MOSFETs 31a–31e that are serially connected. To each connected node of the MOSFET array 31, one terminal of each of the capacitors 32a–32e is connected. The other terminals of the capacitors 32a–32b are driven by the oscillator 40. The output of the oscillator 40 is supplied to the capacitors 32a–32e through drivers 33a–32d, respectively. The drivers 32a and 33c are composed of odd numbers of inverters, and the drivers 33b and 33d are composed of even numbers of inverters, whereby the capacitors 32a–32d are driven by alternately inverted phase signals.

Figure 3B:
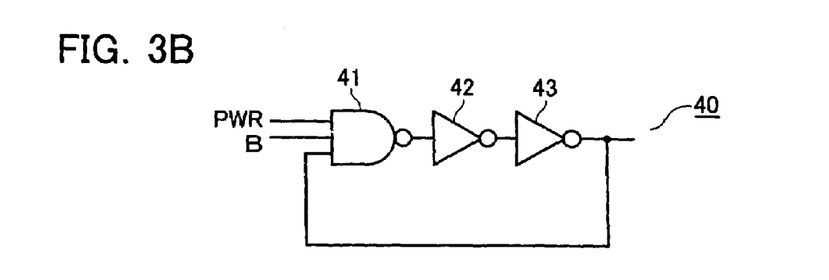

Oscillator 40 is, as shown in FIG. 3B, a ring oscillator in which a NAND gate 41 and inverters 42, 43 are connected to constitute a closed loop. Power-on reset signal PWR, detected output B of the output voltage detecting circuit 50, and a feed-back signal of the oscillator 40 are input to the NAND gate 41. Therefore, while signals PWR and B are "H", the oscillator 40 continues to oscillate.

Figure 3C:
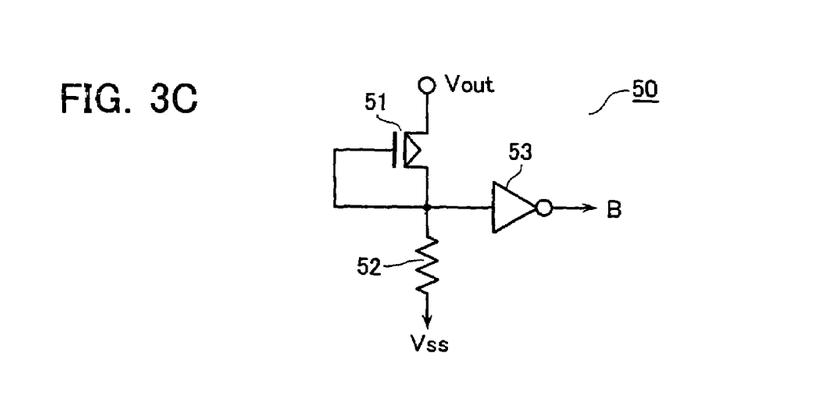

Output detecting circuit 50 is, as shown in FIG. 3C, composed of diode-connected PMOSFET 51 connected to an output node Vout of the charge pump circuit, resister 52 disposed between the drain of PMOSFET 51 and ground terminal Vss, and an inverter 53 whose input is connected to the connect node of the PMOSFET 51 and resister 52. When output voltage Vout of the charge pump circuit is over a predetermined value, output signal B of the detecting circuit 50 becomes "L".

At the beginning of power-on, the output voltage Vout is stayed in "L" level, and the output signal B of the output detecting circuit 50 is "H". After when power-on is detected and power-on reset signal PWR becomes "H", the oscillator 40 begins to oscillate, whereby the charge pump circuit is activated to gradually boost the output voltage Vout. When the output voltage Vout is over the predetermined value, the output detecting circuit 50 outputs B="L". On receipt of this, the oscillator 40 is inactivated, and the boost operation stops. The output voltage Vout becomes lower than the predetermined level, the oscillator 40 begins to oscillate again. As a result, the output voltage Vout is held in a substantially constant level.

Figure 4A:
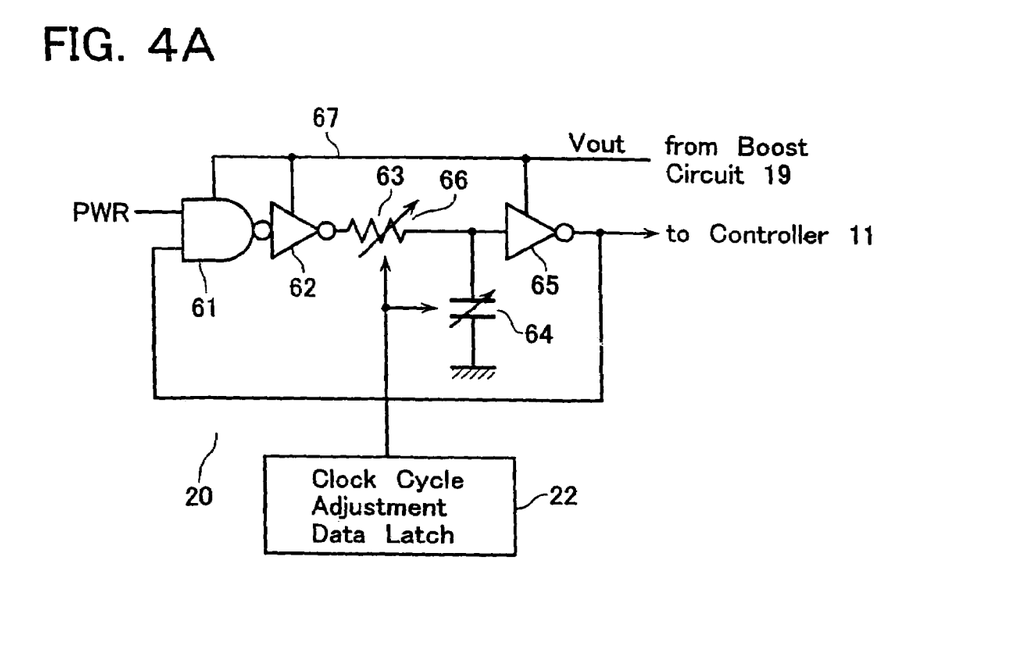
FIGS. 4A and 4B show a clock generator configuration of the EEPROM.

FIG. 4 shows a construction of the clock generator 20. The clock generator 20 has a ring oscillator that oscillates on receipt of the power-on reset signal PWR. A NAND gate 61 and inverters 62, 65 are ring-connected to constitute the ring oscillator. Between the inverters 62 and 65, a CR time constant circuit 66 serving as a delay circuit, which is composed of a variable resister 63 and a variable capacitor 64, is disposed. The resistance of the variable resister 63 and the capacitance of the variable capacitor 64 are set to be optimum values based on the clock cycle adjustment data held in the clock cycle adjustment data latch circuit 22. As a result, the cycle of the output clock signal from the clock generator 20 is set to be an optimum value.

To a power supply terminal 67 of the clock generator 20, the boosted output voltage of the boost circuit 19 is supplied as an internal power supply voltage. As described above, the boost circuit 19 begins to boost the power supply voltage Vcc simultaneously with power-on. Therefore, as soon after power-on, a sufficiently boosted internal supply voltage is supplied to the clock generator 20.

Figure 4B:
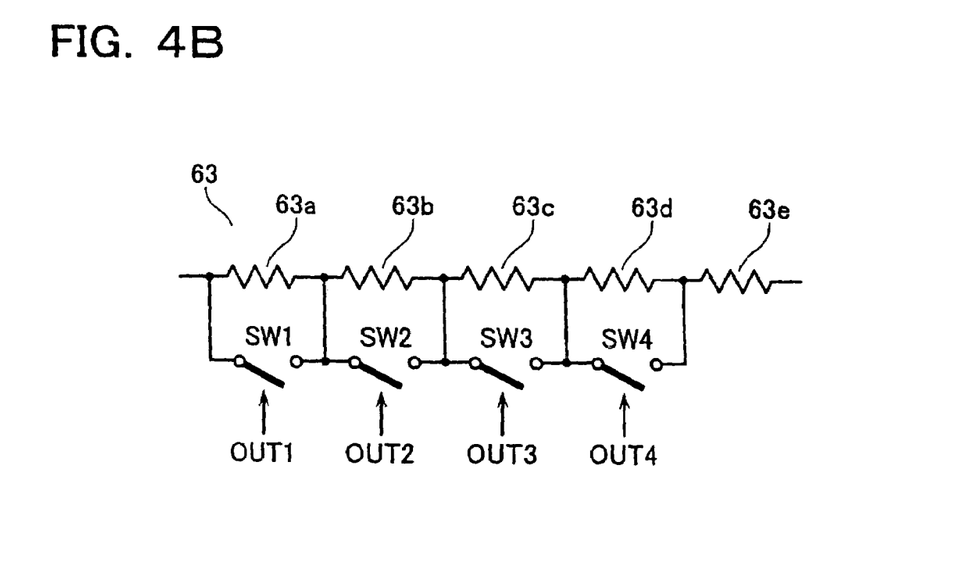

The variable resister 63 is, for example as shown in FIG. 4B, composed of serially connected resisters 63a–63e and switches SW1–SW4 that are prepared to shunt the resisters 63a–63e, respectively. ON and OFF states of the switches SW1–SW4 are determined based on the combination of "H" and "L" of 4-bits signals OUT1–OUT4, which constitute the clock cycle adjustment data. The resister value of the variable resister 63 is determined by the above-described state of the switches SW1–SW4, thereby determining a time constant of the time constant circuit 66 (i.e., a delay time of the delay circuit). The variable capacitor 64 may be composed of a plurality of capacitors and switches as similar to the variable resister 63.

Figure 5:
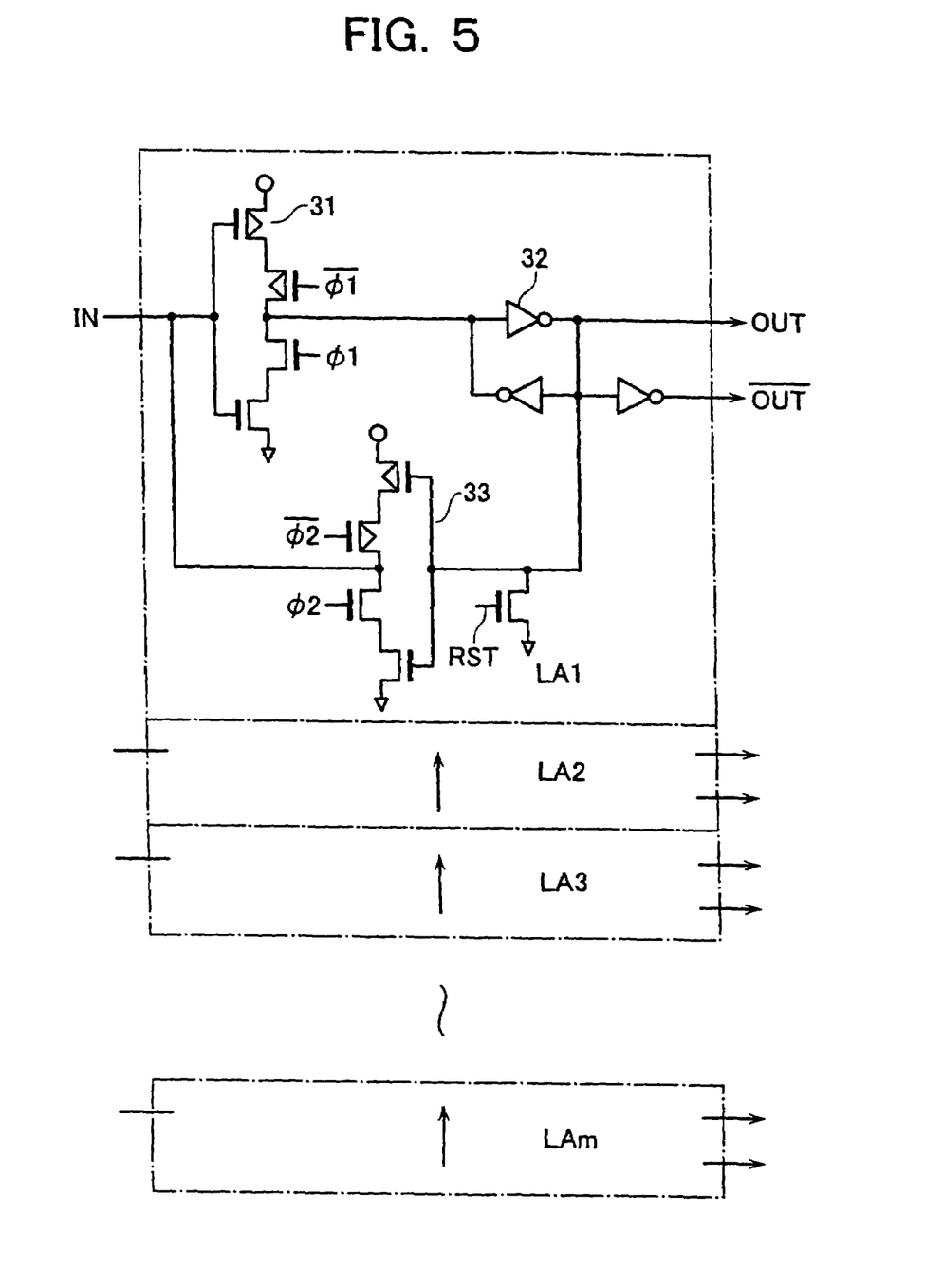
FIG. 5 shows an initial set-up data latch circuit of the EEPROM.

As shown in FIG. 5, the clock cycle adjustment data latch circuit 22 is composed of latch circuits LAl–LAm the number of which corresponds to a necessary data bits. Each latch circuit LA has a latch 32, and a clocked inverter 31 which is prepared to take in a data supplied to an input node IN via the data bus BUS. Outputs OUT, /OUT of the latch circuit LA are supplied to the clock generator 20 as the clock cycle adjustment data. Each latch circuit LA has another clocked inverter 33 which is prepared to output the stored data to the data bus BUS via the input node IN. This clocked inverter 33 will be activated in a test mode. The data latch circuit 22 is reset by a reset signal RST that is generated at power-on time and a test mode time, but otherwise is not reset in a normal memory operation.

The defective address data latch circuit 13, voltage adjustment data latch circuit 15 and chip information data latch circuit 18 are composed as similar to the clock cycle adjustment data latch circuit 22. A select circuit 21 is prepared to transfer the sequentially read out data from the initial set-up data region 3 of the memory cell array 1 to the respective data latch circuits 13, 15, 18 and 22 in the beginning of power-on.

Next, the initializing operation of the EEPROM will be described in detail. When the power supply is switched on, the power-on reset circuit 17 outputs the power-on set signal PWR. The controller 11 is set to be a read mode on receipt of the power-on reset signal PWR, and then make the address register 12 output internal address signals in sequence for read-scanning the initial set-up data region 3. The internal address signals are supplied to row decoder 4 and column decoder 7. As a result, the initial set-up data are sequentially read out from the initial set-up data region 3, and transferred to the corresponding data latch circuits 22, 13, 15 and 18.

In this initializing operation, what is read out in the beginning is the clock cycle adjustment data. This clock cycle adjustment data is transferred to the clock cycle adjustment data latch 22 and held therein. Hereinafter, the clock generator 20 output clock signals, whose clock cycle is controlled by the clock cycle adjustment data, to the controller 11. Therefore, the remaining internal address signals are generated based on the cycle-adjusted clock signals, thereby reading out the defect address data, voltage adjustment data for controlling the boost circuit 8 and chip information data in sequence. These read out data are transferred to the data latch circuit 13, 15 and 18.

During the above-described initializing operation, the ready/busy register 16 outputs a ready/busy signal, R/B="L" (busy), to an external terminal, that designates as an access inhibition state.

As described above, according to the embodiment, initial set-up data are stored in the memory cell array 1. The initial set-up data are read out from the memory cell array 1 and transferred to the initial set-up data latch circuits 13, 15, 18 and 22. In the initializing operation, the clock adjustment data is firstly read out, and the remaining initial set-up data are read out by the cycle-adjusted clock signals. Therefore, almost initial set-up data are read out by a stabilized clock signals, whereby memory initializing time may be shortened.

Further, in this embodiment, boost circuit 19 is prepared for supplying an inner power supply voltage to the clock generator 20 in addition to the boost circuit 8 for outputting high voltages used for programming, erasing and the like. By use of the boost circuit 19, a sufficiently stabilized internal power supply voltage can be supplied to the clock generator 20 during the power supply voltage is not yet stabilized after power-on. This also makes the memory initializing period be shortened.

Figure 6A:
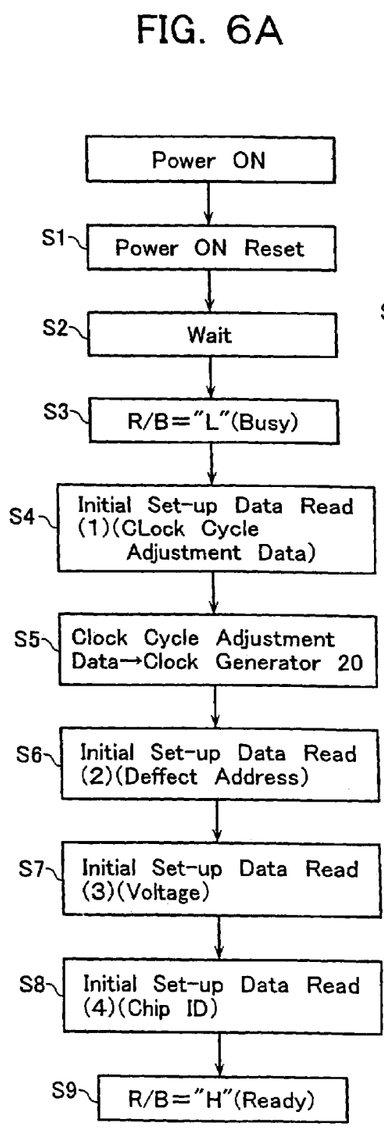
FIGS. 6A and 6B show flow charts of the initial set-up data read operation according to the embodiment.

FIGS. 6A and 6B show an example of control flow chart of the above-described initial set-up operation controlled by the controller 11. As shown in FIG. 6A, when the power supply switch is turned-on, the EEPROM is power-on reset (step S1). After a predetermined waiting period lapses (step S2), the ready/busy register is set to be "L" (=busy state) (step S3). Next, first initial set-up data read is performed, and the read out clock cycle adjustment data is transferred to the clock cycle adjustment data latch circuit 22 (step S4). Hereinafter, the clock cycle adjustment data is output to control the clock generator 20 to output clock signals with an adjusted clock cycle (step S5). Next, second initial set-up data read is performed to read out and set the defective address data (step S6). The remaining initial set-up data are sequentially read out and set (step S7, S8). After all the initial set-up data read are performed, the ready/busy register is set to be "H" (=ready state, i.e., stand-by state) (step S9).

Figure 6B:
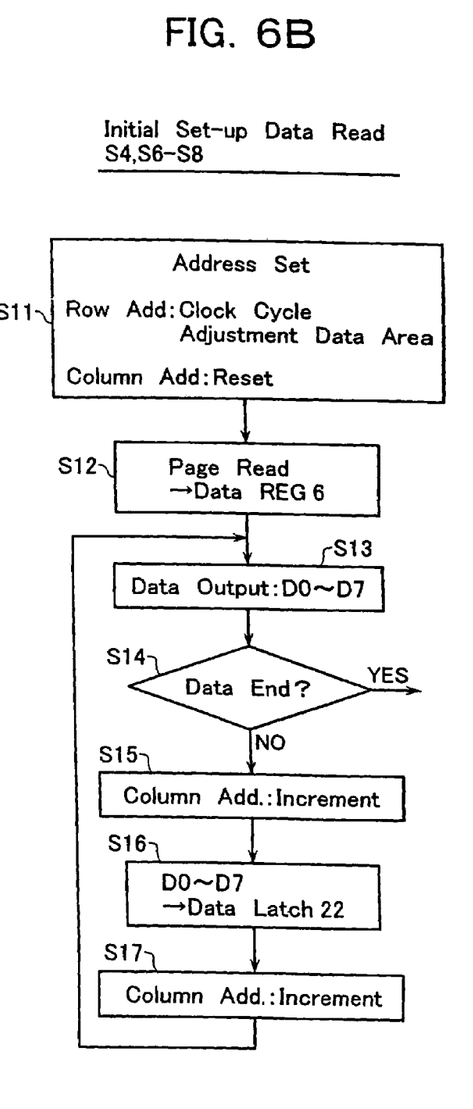

FIG. 6B shows a detailed operation flow chart of the initial set-up data read step S4 typically selected in the steps S4, S6, S7 and S8. In this example, the clock cycle adjustment data is stored in 1-page selected by a row address, which includes plural memory cells arranged along a word line WL, in the initial set-up data region 3. Therefore, in the beginning, row address is set to access the clock cycle adjustment data area, and column address is reset (step S11). Next, perform 1-page read operation selected by the row address, thereby latching the read out data into the data register 6 (step S12). Practically, 1-page data is composed of a plurality of bytes to which different column addresses are assigned. Further, each of 1-byte adjustment data is followed after 1-byte index data that designates whether the 1-byte adjustment data is effective or not. In other words, 1-byte index data and 1-byte adjustment data are alternately arranged in 1-page data.

Therefore, read out 1-byte index data D0–D7 at the head in 1-page data held in data register 6 (step S13), and then verify data end (step S14). The step S14 is prepared to verify whether an effective data is followed or not. If it is verified that there is no effective data, this initial set-up data read is ended, then next initial set-up data read by a different row address is performed. When it is verified that there is an effective data, increment the column address (step S15), then read out and transfer the following 1-byte adjustment data D0–D7 to the data latch circuit 22 (step S16). Hereinafter, the same operations are periodically performed until all effective data are read out.

As above-described, the read operation of the initial set-up data and transfer operation thereof to the corresponding data latch circuit are automatically performed after power-on. Although, in the above-described example, controller 11 automatically starts the initializing operation on receipt of the power-on, other methods can also be used. For example, a command input method is useful. In this case, the controller 11 decodes the input command and starts the same initial set-up operation as described above.

When the initializing operation is ended, ready/busy(R/B)="H" (ready state) is output, thereby enabling ordinary data read, program and erase operations. In these ordinary operation modes, when an address is input to address register 12, the input address is compared with the defect address stored in the defective address data latch circuit 13 by the address matching detecting circuit 14. When address matching is detected, the detecting circuit 14 outputs replace control signals "Ra" and "Rb", thereby controlling the row decoder 4 and column decoder 7. As a result, a defective cell array including a defect cell is replaced with a redundant cell array. Further, the voltage adjustment data latch circuit 15 outputs a suitable control data to the boost circuit 8, thereby outputting a boosted voltage necessary in correspondence to program, erase and read modes.

In this embodiment, such test mode programs are installed for checking and rewriting the initial set up data stored in the EEPROM chip as follows:

Test mode 1: check the initial set-up data stored in the initial set-up dada region 3 of the memory cell array 1.

Test mode 2: rewrite the initial set-up data stored in the initial set-up dada region 3 of memory cell array 1.

Test mode 3: check the initial set-up data stored in the initial set-up data latch circuits 13, 15, 18 and 22.

Test mode 4: rewrite the initial set-up data stored in the initial set-up data latch circuits 13, 15, 18 and 22.

The controller 11 performs these test modes on receipt of predetermined command inputs. When a predetermined command data for selecting the test mode 1 is input, the controller 11 outputs sequentially incremented internal addresses in the same manner as above-described initializing operation, thereby reading out the initial set-up data stored in the initial set-up data region 3. The read out data by the sense amp circuit 5 are output to external via the I/O buffer 9. Therefore, it becomes to be able to check the initial set-up data on the outside of the chip.

Test mode 2 is set by another command input. In the beginning of this mode, the controller 11 performs data erase for the whole data region 3 or partial cell blocks thereof, and then is set to a program mode. In the program mode, controller 11 outputs internal address signals that sequentially access the initial set-up data region 3. To-be-programmed data is held in the data register 6, and then programmed in the initial set-up data region 3 by a program control signal output from the controller 11.

Test mode 3 is preformed by a different command input. In this test mode 3, the controller 11 performs to read out and check data held in the defect address data latch circuit 13, voltage adjustment data latch circuit 15, chip information data latch circuit 18, and clock cycle adjustment data latch circuit 22. As shown in FIG. 5, the initial set-up data latch circuits 13, 15, 18 and 22 have clocked inverter 33 for outputting the stored data to input-side data bus BUS. In this test mode 3, controller 11 sequentially outputs read clocks, φ2="H", to the initial set-up data latch circuits 13, 15, 18 and 22. As a result, the stored data are output to external via the data bus BUS and I/O buffer 9, whereby it becomes to be able to check the initial set-up data on the outside of the chip.

Test mode 4 is set by another command input. In this test mode 4, without rewriting the initial set-up region 3, it is able to program data input from external in the initial set-up data latch circuits 13, 15, 18 and 22 via the data bus BUS. Therefore, memory operation condition tests may be performed based on the rewritten initial set-up data with the power supply being in on-state.

As described above, according to the present invention, it is able to shorten a waiting period from power-on time to the initial set-up end from when normal memory operations can be performed.

What is claimed is:

1. A non-volatile semiconductor memory device comprising:
    a memory cell array having non-volatile memory cells arranged therein, in which initial set-up data including a clock cycle adjustment data are stored;
    data latch circuits configured to hold said initial set-up data read out from said memory cell array; and
    a controller configured to control operations of said memory cell array.

2. The non-volatile semiconductor memory device according to claim 1, further comprising a clock generator configured to generate a clock signal that is used to define an operation timing of said controller.

3. The non-volatile semiconductor memory device according to claim 1, wherein said controller is so programmed as to read out the clock cycle adjustment data in the beginning after power-on.

4. The non-volatile semiconductor memory device according to claim 2, wherein said controller is so programmed as to read out the clock cycle adjustment data in the beginning after power-on; thereby adjusting a clock cycle of said clock signal output from said clock generator by use of said clock cycle adjustment data, and then read out the remaining initial set-up data.

5. The non-volatile semiconductor memory device according to claim 1, wherein
    the remaining initial set-up data contain defective address data, control data used for controlling memory operations and code data.

6. The non-volatile semiconductor memory device according to claim 1, further comprising
    a ready/busy signal circuit configured to output a busy signal during said initial set-up data are read out from said memory cell array and transferred to said data latch circuits.

7. The non-volatile semiconductor memory device according to claim 1, further comprising:
    a power-on detecting circuit configured to detect power-on so as to activate said controller for performing data read out operation of said initial set-up data stored in said memory cell array.

8. The non-volatile semiconductor memory device according to claim 2, wherein said clock generator comprises;
    a ring oscillator; and
    a delay circuit disposed in said ring oscillator, a delay time of which being defined by said clock cycle adjustment data.

9. The non-volatile semiconductor memory device according to claim 8, wherein
    said delay circuit comprises a CR time constant circuit having a resistor and a capacitor, at least one of which is variably controlled in response to said clock cycle adjustment data.

10. The non-volatile semiconductor memory device according to claim 2, further comprising:
    a boost circuit configured to boost a power supply voltage in response to power-on so as to supply a boosted voltage to a power supply node of said clock generator.

11. The non-volatile semiconductor memory device according to claim 1, wherein
    said controller has a test mode so programmed as to check and rewrite said initial set-up data stored in at least one of said memory cell array and said data latch circuits on receipt of a command input from an external terminal.

12. The non-volatile semiconductor memory device according to claim 1, wherein
    said memory cell array has a plurality of NAND cell units each of which has a plurality of serially connected memory cells and a select transistor through which said serially connected memory cells are connected to a bit line, said serially connected memory cells being driven by different word lines from each other.

13. The non-volatile semiconductor memory device according to claim 2, further comprising:
    a first boost circuit configured to output a boosted voltage necessary for data read, program and erase of said memory cell array; and
    a second boost circuit configured to boost a power supply voltage in response to power-on so as to supply a boosted voltage to a power supply node of said clock generator.

14. The non-volatile semiconductor memory device according to claim 1, wherein each of said data latch circuits comprises plurality of latch circuits the number of which corresponds to a necessary data bits.

* * * * *